United States Patent [19]

Tuttle

[11] Patent Number: 5,391,991

[45] Date of Patent: Feb. 21, 1995

[54] CABLE SHIELD RESISTANCE TEST SET

[75] Inventor: John E. B. Tuttle, Falls Church, Va.

[73] Assignee: The United States of America as represented by the Secretary of the Army, Washington, D.C.

[21] Appl. No.: 128,172

[22] Filed: Sep. 29, 1993

[51] Int. Cl.6 .............................. G01R 27/14
[52] U.S. Cl. ................... 324/529; 324/537; 324/127; 324/718
[58] Field of Search ............ 324/537, 539, 543, 522, 324/525, 527–530, 601, 691, 710, 713, 715, 718, 127; 336/175, 176

[56] References Cited

U.S. PATENT DOCUMENTS

| | | | |
|---|---|---|---|
| 2,677,100 | 4/1954 | Hayhurst | 324/543 |
| 3,702,966 | 11/1972 | Schweitzer, Jr. | 324/543 |
| 3,839,672 | 10/1974 | Anderson | 324/543 |
| 4,283,678 | 8/1981 | Halter | 324/539 |
| 4,973,911 | 11/1990 | Marshall | 324/539 |
| 5,189,375 | 2/1993 | Tuttle | 324/601 |

Primary Examiner—Maura K. Regan
Attorney, Agent, or Firm—Freda L. Krosnick; Frank J. Dynda

[57] ABSTRACT

A technique and apparatus for measurement of resistances of 0.025 ohm and less without disconnection from the circuit. The invention is used for measurement of degradation in cable shields. The method can also be used for measurement of junction resistances in high current circuits such as auto starters. The invention allows measurements to be made with the circuits connected so that the faults are present in the measurement setup. The method includes inductive coupling of long duration repetitive current pulses onto the circuit under test, measurement and display of induced current and voltage pulses, and display of induced current and voltage pulses on an oscilloscope.

1 Claim, 12 Drawing Sheets

CABLE SHIELD RESISTANCE TEST SET

RIGHTS OF THE GOVERNMENT

The invention described herein may be manufactured, used and licensed by or for the United States Government for Governmental purposes without payment of any royalty thereon.

BACKGROUND OF THE INVENTION

1. Field of the Invention

The present invention relates generally to methods and apparatus for measurement of very small circuit resistances (0.025 ohm or less) without disconnection of the circuit and particularly to an improved version of the apparatus previously developed by the inventor. The earlier version of the method and apparatus are described in U.S. Pat. No. 5,189,375. This improved version, though similar in some respects to the earlier patented version, employs a different measurement principle which extends the range of resistances that can be measured. In addition, individual resistances within the circuit under test can now be measured, which is an improvement over the earlier version which measured total circuit resistance. Further, the inductance of the circuit can also be measured without disconnection.

2. Description of the Prior Art

Electromagnetic Pulse (EMP) hardness assurance maintenance and surveillance programs and system life cycle study programs have been established by all branches of the military which have fielded systems with EMP survival requirements. A major portion of these programs is concerned with measurement of cable shield degradation over the lifetime of the system so that short and long term maintenance actions can be planned. The systems which require these support programs include mobile and fixed C3 (Command, Control and Communications) systems, combat vehicles (battle tanks), aircraft, and naval vessels. To support these programs, computer based data collection systems featuring network analyzers have been built or are planned. These Computer controlled network analyzers provide the capability to collect, process, and store large amounts of high quality data in the form of transfer impedance (Zt) vs frequency plots from 5 Hz to 200 MHZ. Such systems have been configured into depot testers used primarily by the Air Force logistics command. Although the use of Zt vs frequency plots in a 200 MHz bandwidth allows the data analyst to diagnose cable connector problems and to track gradual deterioration of cable shields over the lifetime of the cable, the method has several drawbacks:

First, the cable must be disconnected at one or both ends so that access to interior conductors can be gained. Disconnection of a cable from its equipment (though temporary) may eliminate a flaw or a source of degradation from the measurement environment, consequently, a flaw may go undetected.

Secondly, Zt vs frequency plots are time consuming; this is especially significant when the system to be tested is a major aircraft such as a bomber (B52) or intelligence, reconnaissance, surveillance aircraft (AWACS). Such aircraft reportedly have up to 600 cables some of which are multiple branch cables. Further, such major systems are available for maintenance testing infrequently and for very short time intervals. This translates to incomplete testing because of insufficient time or unacceptable delays in scheduling other tests on the aircraft by other organizations.

Thirdly, network analyzer based depot testers are operated by highly skilled contractor personnel who must travel to the various sites and depots where testing must be performed.

Fourthly, the initial cost of such systems is high.

The technique of inductively coupled low resistance measurement is proposed as a very inexpensive complement to the more orthodox methods. Since the subject invention can be inexpensively mass produced and can be easily used by relatively unskilled personnel, it may be cost effectively distributed to local maintenance organizations. Many of the problems detectable via the subject invention can be repaired on the spot by such actions as cleaning threads on a connector backshell or tightening the coupling nut of a panel connector. With additional effort, the method and apparatus can be adapted to the inspection of conductors in the grounding systems of computer and communications facilities (fixed sites) and to the inspection of metal conduits.

Flaws in the shields of cables can usually be traced to connectors. These flaws which can result from improper bond between cable shield and connector backshell, mechanical stress, or metal oxide buildup at connector junctions, introduce resistances in series with the cable shield and reduce the overall effectiveness of the shield. When such flaws are present, they can be sometimes detected by the above described measurements of transfer impedance vs frequency obtained with a network analyzer or by direct measurement of cable shield resistance obtained with a milliohmeter. The presence of a flaw in the shield will be indicated by an increase in transfer impedance (ohms/length) or shield resistance (ohms) above a previously established maximum allowable value. Typical acceptable values of shield resistance of cables in real systems will range from ten milliohms (0.01 ohm) to several tenths of ohms depending upon such cable parameters as length, diameter, characteristics of the shield material, and allowable junction resistances.

It is not always desirable to attempt detection of cable shield flaws by measurements of transfer impedance or shield resistance by the standard techniques. Both techniques require that the equipment terminating the cable under test be disconnected. When measurements are made on a cable disconnected from its equipment, a serious flaw may go undetected. Disconnection may relieve the mechanical stress that caused the flaw or may eliminate a resistive junction between cable connector and equipment connector. Also, the shield flaw may exist, not within the cable, but at the junction between equipment connector and equipment enclosure. Thus, inspection for flaws in cable shields should be done with the cable connected to its terminating equipment so that all sources of shield degradation will be present in the measurement environment. It should also be stated that flaws can develop in cables which may decrease the shield resistance. Such flaws occur when a cable shield becomes shorted to the wall or floor of the enclosure (vehicle or aircraft) in which the cable is located. This type of flaw has been known to occur in aircraft when the cable shield insulation is severed due to mechanical stress. This type of fault effectively changes the length of a cable and this condition can be identified by a decrease in circuit inductance. Therefore, detection of flaws and degradation in cable shields translates to location and measurement of low valued resistances and inductances without disconnecting the circuit under test.

Accordingly, it is an object of the present invention to provide an inductively coupled low resistance measurement method and apparatus which can be used without disconnecting the circuit under test.

It is another object of the present invention to provide an inexpensive cable test set that works in combination with a user supplied portable oscilloscope that provides a continuous display of a pulsed current waveform induced on a cable by the test set and/or a continuous display of a pulsed voltage waveform that is developed across resistive junctions due to the induced current.

SUMMARY

Briefly, the foregoing and other objects are achieved by an inductive coupler and coupler driver combination such that long duration current pulses are induced to flow in a cable or shield under test without disconnecting the circuit. The current pulses are sensed by a current probe and displayed continuously on an oscilloscope. A pulsed magnetic field is generated by the inductive coupler/driver combination. When the coupler is connected for use, its core and windings surround the cable under test. A current is induced in the shield or cable and a corresponding magnetic field is established over the length of the cable or shield. The magnetic field established by the induced current is sensed by the current probe which provides a voltage output proportional to the induced cable current. If the circuit under test contains a high resistance or is open, little or no current will flow; however, voltage differences can be measured across junctions within the circuit. The waveform of voltage that will exist across a junction is sampled via a voltage probe and displayed by the oscilloscope. Thus, a high resistance junction or open junction can be identified. The resistance of an individual junction can be determined from circuit current measured with the current probe and from voltage measured across the junction.

BRIEF DESCRIPTION OF THE DRAWINGS

The invention will be better understood if reference is made to the accompanying drawings, in which:

FIGS. 4(a, b and 4c) shows waveforms of inductive coupler drive current, equivalent induced voltage, and typical induced current in a cable under test.

FIGS. 6(a and b) show the connector junction voltage waveforms for the respective "good" and "bad" cables of FIG. 5.

DETAILED DESCRIPTION OF THE INVENTION

In the invention described in U.S. Pat. No. 5,189,375, a 50 microsecond long current pulse with trapezoidal time history was induced to flow on the cable shield 10 under test by the inductive coupler/coupler driver 100/300 combination. The induced cable current i(t) was sampled by a current probe 200 and the waveform of current was displayed by an oscilloscope 50. The unknown shield resistance R was determined from measurement of droop on the pulse displayed by the oscilloscope 50. The allowable resistance (determined from pulse droop) would previously have been determined via a procedure referred to as "Initial Calibration". By this procedure, the cable shield 10 under test would be initially disconnected at one end and a low valued resistance (R=0.025 ohms) would be inserted into the path between the cable 10 and the connector 505 to which the cable shield 10 had been previously connected. Two measurements of droop would be taken, one with and one without the calibrating resistance Rc. From these two measurements, a baseline value of end to end resistance would be obtained whereby subsequent degradation in shield resistance Rx (increase in resistance over time) could be determined. This initial calibration procedure was to have been performed only once per year per cable.

Although the patented version of inductive cable resistance testing has been used successfully at three U.S. Army communications sites to identify bad cable shields, its design was less than optimum for the environment in which it was used. First, RF transmitters were present in the environment which radiated sporadically and interfered with measurement; second, operational constraints (no allowable down time) precluded performance of the initial calibration procedure. The first problem (RF induced interference with measurements) derived from deficiencies in the design of the original test set; e.g., the use of internal triggering of the oscilloscope sweep and marginal amplitude (10 to 30 millivolts) of the signal to be measured. When internal triggering is used, the scope trigger is derived from the signal to be measured. Thus, even in the absence of interference, triggering will sometimes be erratic and the front portion of the trace to be displayed will sometimes be absent.

These deficiencies were overcome by increasing the amplitude and duration of current pulse induced on the cable under test, providing a scope pre-trigger to start the sweep prior to the arrival of the signal to be displayed, and by increasing the sensitivity of the current probe and improving its low frequency characteristic. These modifications improved the sensitivity and dynamic range of the measurement apparatus, desensitized it to RF interference, and simplified the process of extracting the unknown resistance.

These improvements greatly simplified the initial calibration procedure and, where this procedure could not be readily applied, allowed the test technician to obtain an initial value of shield path resistance by computation rather than resistance substitution. This improved method and procedure arises by action of the inductive coupler 100 which injects a known and constant equivalent voltage source into the circuit 10 under test. This equivalent voltage source will be constant for all conductors. The capability of this new test set is enhanced still further by the incorporation of voltage measurement which allows individual sources of resistance within the circuit under test to be identified and measured.

In order to incorporate voltage measurement into the technique what is required is a coaxial cable clip lead adapter 51 to sample voltage across a junction and couple it to the scope 50. Thus, resistance of individual junctions within a cable shield path can be determined from measurement of circuit current and junction voltage.

The differences between the prior patented method and the improved method are:

Under the prior method pulse droop and unknown resistance were related by the formula:

Equation 1:
$$D \text{ (droop)} = \frac{v1 - v2}{v1} = \frac{R \times T}{L}$$

Where V1 and V2 are scope deflections measured in volts over interval T=T1−T2, where T is the width of the sloped region over which droop was measured (T=30 microseconds), Rx is the unknown total circuit resistance in ohms and L is the circuit inductance in microhenries. Equation 1 was applied twice; first, with the circuit as is; then, with a known resistance (Rc) inserted. This yielded two equations in two unknowns from which Rx was calculated. Insertion of Rc, known as the initial calibration, was to be performed only once per cable so that a baseline value of R in equation 1 could be obtained. This baseline value of R would be used in subsequent measurements to determine if degradation in the cable shield (increase in R over time) had occurred. Under the new concept, the unknown total circuit resistance Rt can be obtained by two methods depending upon circumstances.

Method 1. Initial calibration by resistance substitution.

Method 2. Initial calibration by computation.

Method 1 is predicated on use of connectorized cables which can be temporarily disconnected allowing insertion of known calibration resistances. Method 2 must be applied where the cable shield under test 10 is not connectorized or operational constraints preclude disconnection. Where method 1 is used, the initial (baseline) value of total circuit path resistance Rt is obtained by:

Equation 2.
$$Rt = \frac{v2}{v1 - v2} Rc$$

v1 is the amplitude of the scope deflection with the cable under test 10 in its natural state;

v2 is the amplitude of the scope 50 deflection with the calibration resistor Rc inserted; and Rc is the value of the known calibration resistance Rc in ohms.

v1 and v2 are voltage outputs from the inductively coupled current probe 200.

Where method 2 is used, total shield path resistance Rs is computed from:

Equation 3.
$$Rt = \frac{EiZt}{V(\text{scope})} - Rs$$

where Ei is voltage inserted into the cable circuit 10 by action of the inductive coupler 100, Zt is the transfer function of the current probe 200 in ohms, V is peak amplitude of scope deflection in volts and Rs is the equivalent source impedance (ohms) associated with the induced voltage Ei. For a given inductive coupler 100 and driver 300 combination, both Ei and Rs will be constant (Ei=0.2 volts; Rs=0.025 ohms). The probe 200 transfer function Zt will also be known. The resistance of individual junctions within the cable circuit 10 under test can also be measured by applying ohm's law:

Equation 4.
$$R(\text{junction}) = \frac{V(t) \text{ peak (across a junction)}}{i(t) \text{ peak (total path current)}}$$

where i(t) peak is obtained from a scope display of the induced current waveform or:

Equation 5.
$$i(t)\text{peak} = \frac{V(\text{scope})}{Zt}$$

To find the unknown resistance Rx, the person performing the measurement applies method 1 of the initial calibration procedure if said measurement is a "first time" measurement and disconnection is allowed; equation 2 above applies.

If Rt is known from a previous measurement, the new value of unknown cable shield resistance can be found from:

Equation 6.
$$Rx = Rt(\text{baseline}) \frac{v1}{v3} \frac{\text{(baseline)}}{\text{(new)}}$$

where v1 was previously measured and recorded during initial calibration procedure and v3 is scope deflection voltage derived from the output of the current probe 200 for the new measurement.

To find the unknown resistance in an environment where disconnection of the cable is not possible and the measurement to be taken is first time or baseline, method 2 applies. The initial measurement of the cable shield path resistance is obtained from equation 3.

equation 3.
$$Rt = \frac{EiZt}{V(\text{scope})} - Rs$$

where all terms are as previously defined.

For most practical cables, Rs is negligible, thus Equation 3 reduces to;

Equation 3a.
$$Rt = \frac{EiZt}{V1(\text{scope})}$$

If Rt is known from a previous measurement, the new value of unknown resistance Rx can be found from equation 6.

Equation 6.
$$Rx = Rt(\text{baseline}) \frac{v1(\text{baseline})}{v3(\text{new})}$$

Figure 1:
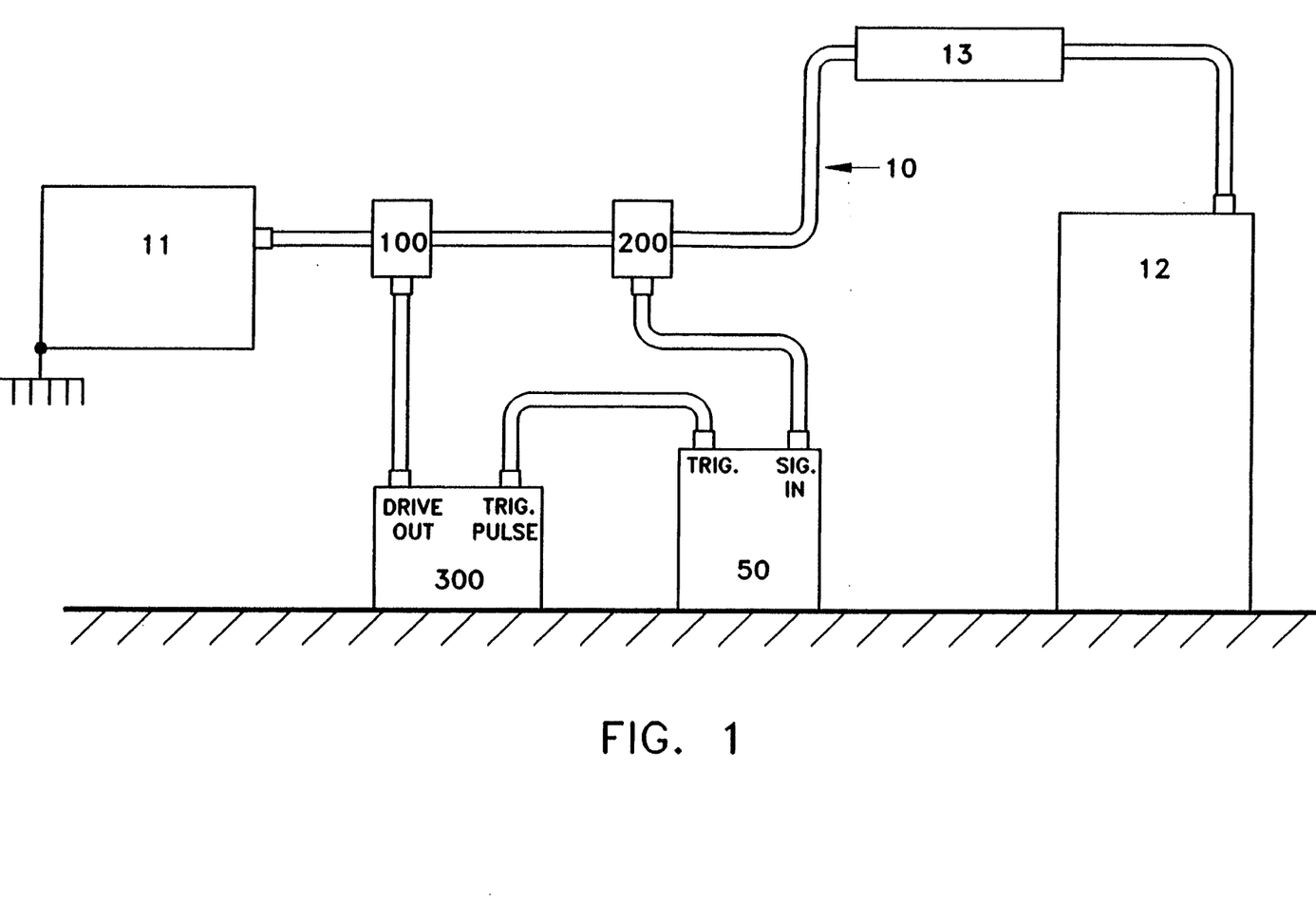
FIG. 1 shows the interior of a typical communications facility with the cable tester installed.

In the environment of FIG. 1, the resistance Rt to be measured is the total of all resistances contained within the cable shield path; stated in more compact form:

$$R(\text{total}) = R(\text{shield}) + R(\text{return}) + R(\text{source}) + R(\text{junction}) \quad \text{equation 7}$$

where the fourth term on the right side of equation 6 represents the total of all connector junction resistances in the cable path. In general, connector junction resistances are the largest contributors to total resistance. For a single cable connecting two shielded enclosures, 6 junctions will exist as listed below:

| | | |
|---|---|---|
| 1. | Cable shield to cable connector backshell | 2 each. |
| 2. | Cable connector to equipment connector | 2 each. |
| 3. | Equipment connector to equipment enclosure | 2 each. |

Any or all of these may develop unacceptably high resistance whose presence can be detected from the waveform of induced current. FIG. 5b illustrates an extreme case. When an open or an excessively high resistance is indicated, the procedure illustrated in FIG. 3 should be followed to locate the fault.

Typical results that would be obtained from the execution of this procedure are shown in FIGS. 6a and 6b where 6b shows a voltage waveform corresponding to an open junction.

Figure 5:
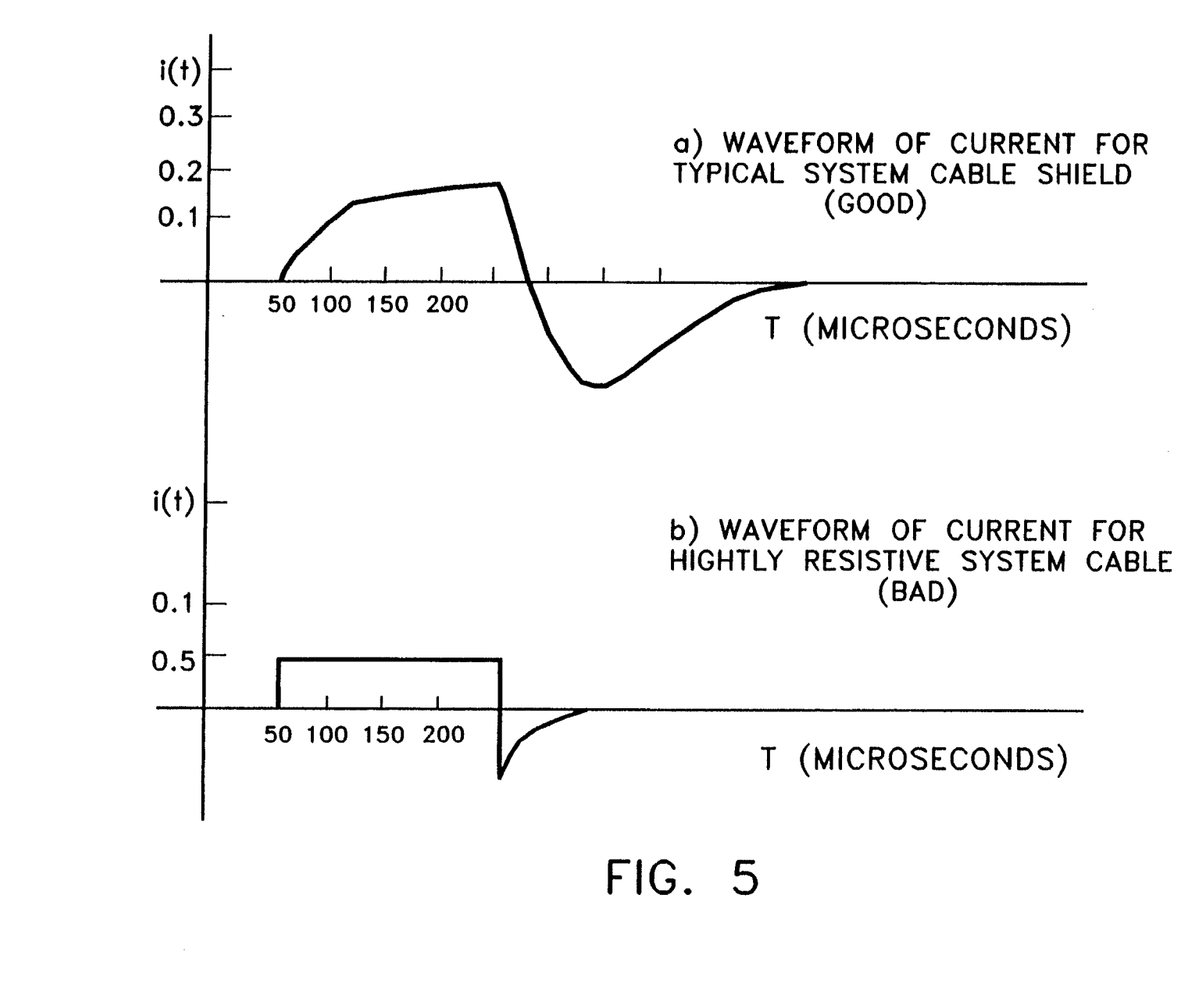
In FIG. 5(a) shows representative waveforms of current recorded from a "good" cable.
FIG. 5(b) shows representative waveforms of current recorded from a "bad" cable.
Figure 6:
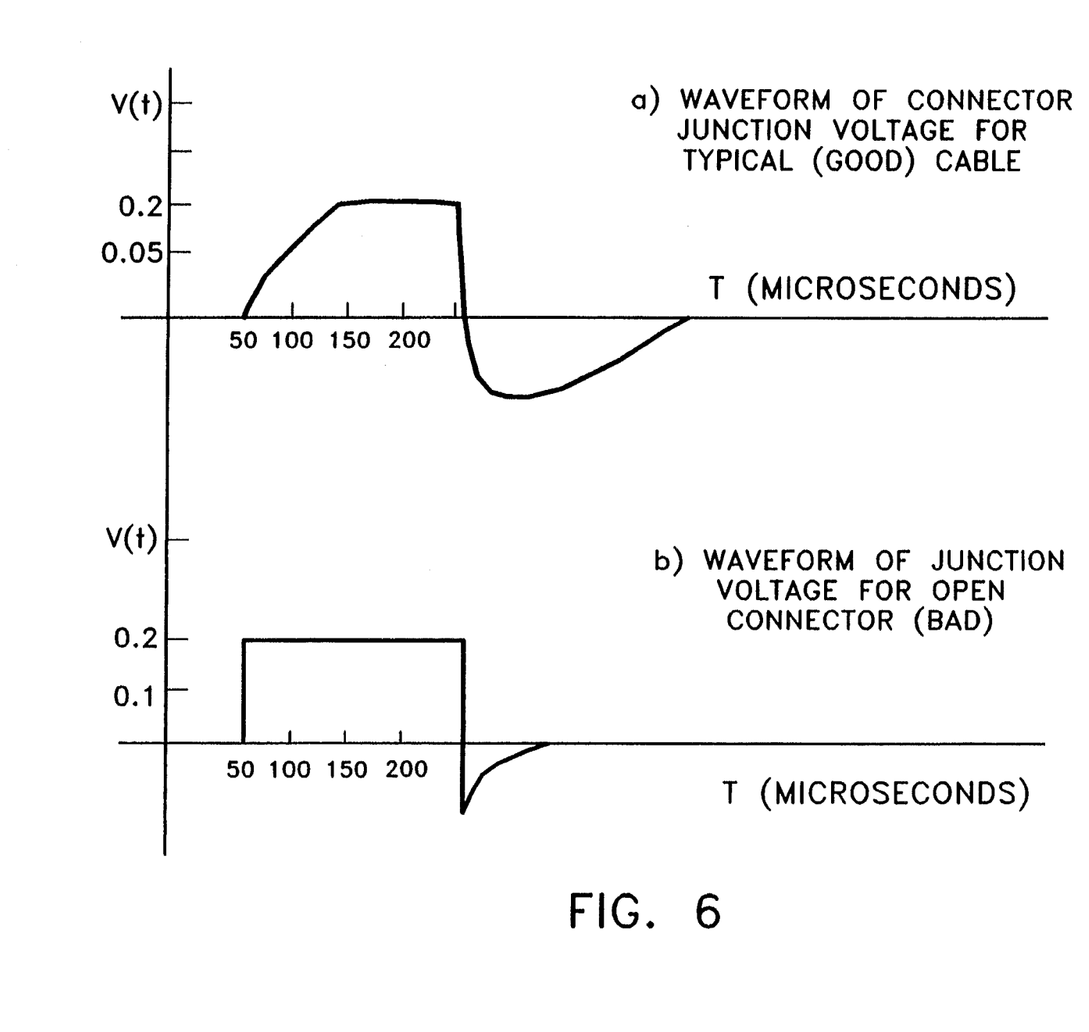

FIG. 5 shows cable current waveforms taken from a fielded system; FIG. 5a shows the response of a cable shield that is somewhat degraded but still within tolerance; FIG. 5b clearly shows the response of a bad cable shield. FIG. 6 shows waveforms of voltage for the cables of FIG. 5. These voltages were sampled between the cable connector backshell and the connector of the system equipment shelter. The voltage waveform of 6a shows the IR drop across several junctions between the cable shield and the shelter; the waveform corresponds to that of a "good" cable shield. The waveform of 6b clearly shows an open between the two sample points; the open was found to be at the junction between the panel connector and the connector panel. The cause of the open circuit was incorrect seating of the panel connector in its hole which allowed moisture to enter. Prolonged exposure to moisture caused oxide film to form at the connector/panel interface.

Figure 3:
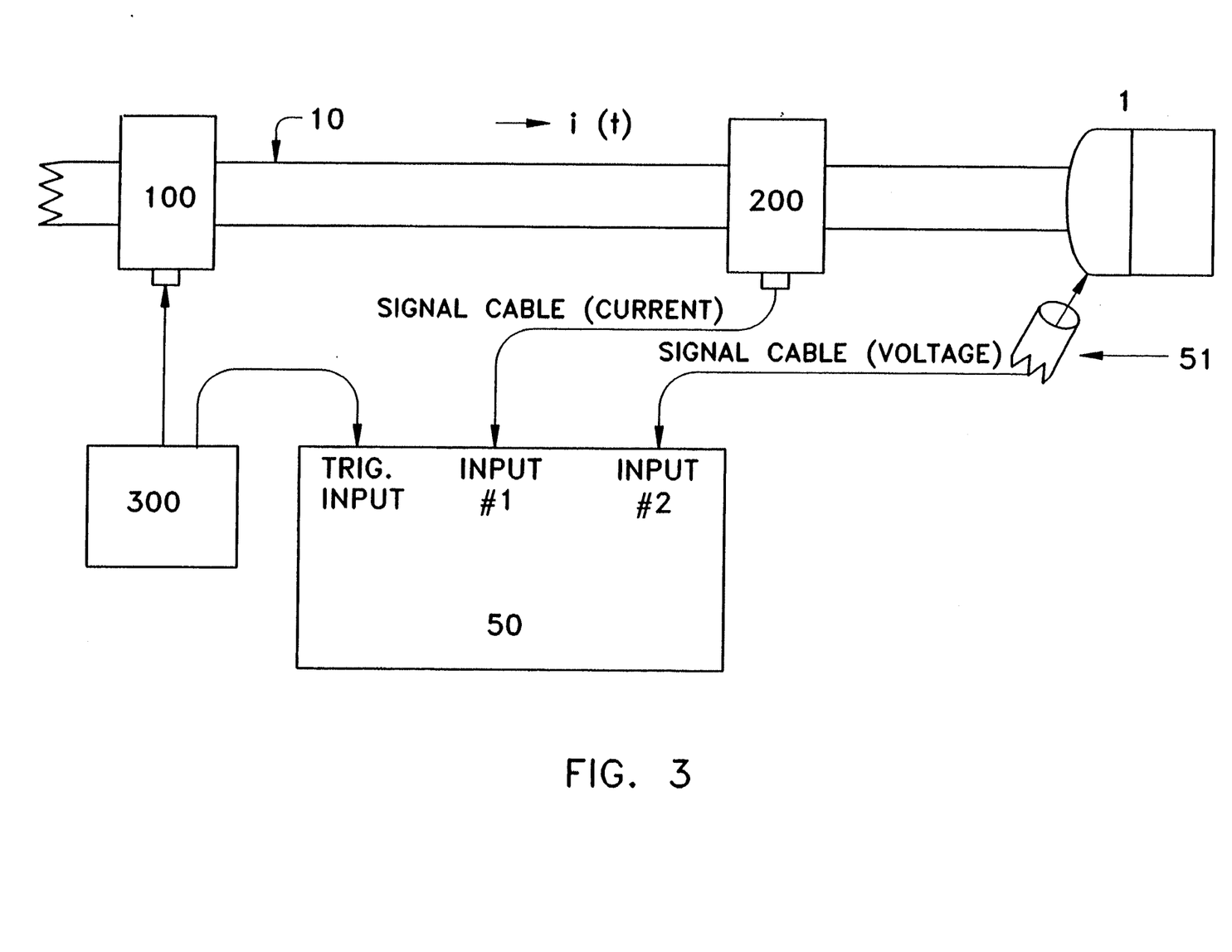
FIG. 3 shows the apparatus connected to measure junction resistance of a connector in the path of a cable under test.

FIG. 3 shows the apparatus 51 connected to a cable and configured to measure resistance of a connector junction. The voltage across the connector junction is sampled via a coaxial to cliplead adapter which couples the signal to an input of the oscilloscope. Typically, a scope with two vertical channels will be used so that the current and voltage waveforms can be viewed simultaneously. The resistance of the junction will be determined from the peak amplitudes of the two scope traces and the application of ohm's law or;

Equation 8.

-continued
$$R(\text{junction}) = \frac{V_v(\text{voltage trace})}{V_i(\text{current trace})} \cdot Z_t(\text{probe})$$

where Zt for the current probe 200 is known and is specified in Volts/Amp or ohms.

A voltage display can be calibrated directly in ohms by utilization of standard oscilloscope techniques by one working in the art.

Figure 2:
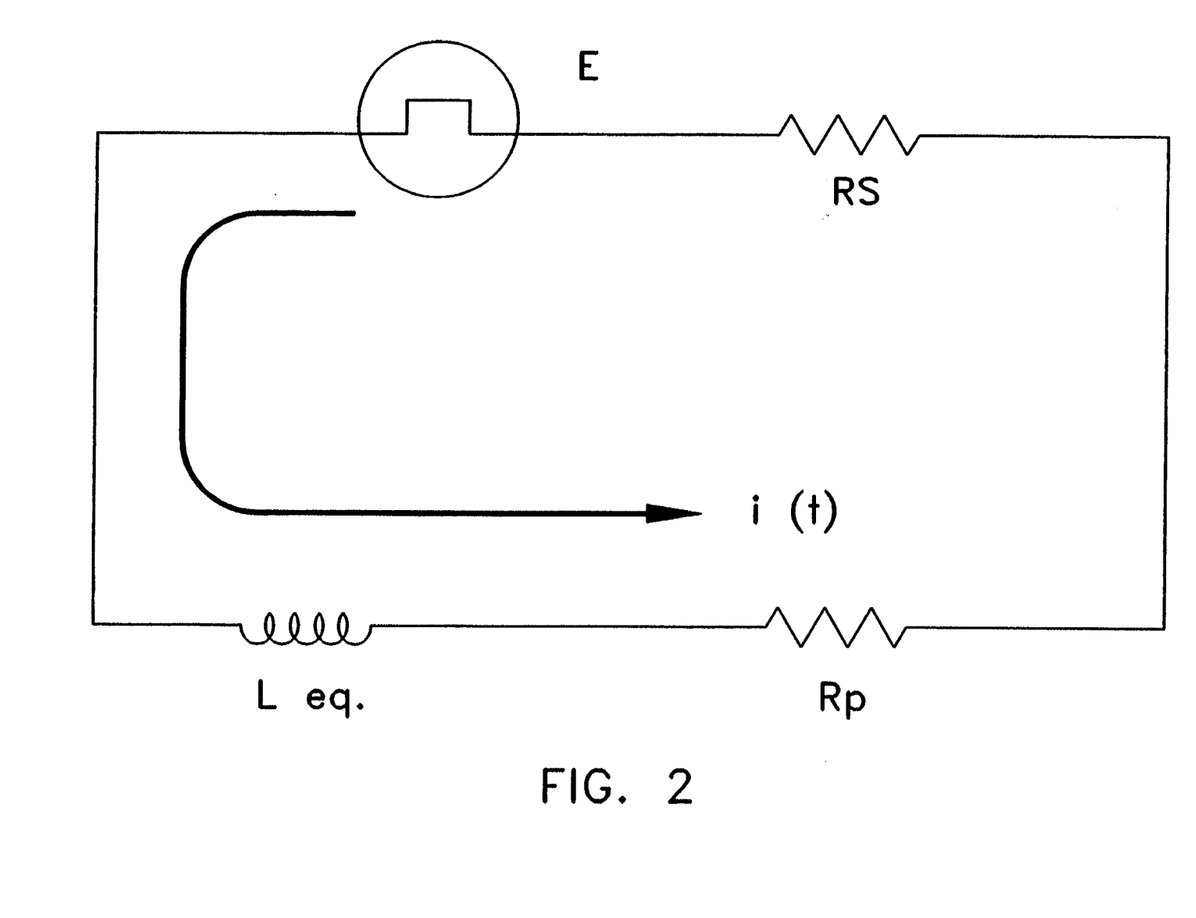
FIG. 2 is a schematic of the equivalent circuit of a cable under test excited by an inductive coupler and loaded by an inductive probe.

The equivalent circuit of the cable under test, excited by the inductive coupler 100 and loaded by the current probe 200, is shown in FIG. 2. Ei is the equivalent voltage source injected into the cable shield path by action of the inductive coupler 100, R is the total circuit resistance, and L is the equivalent circuit inductance which can be measured if desired.

Figure 4:
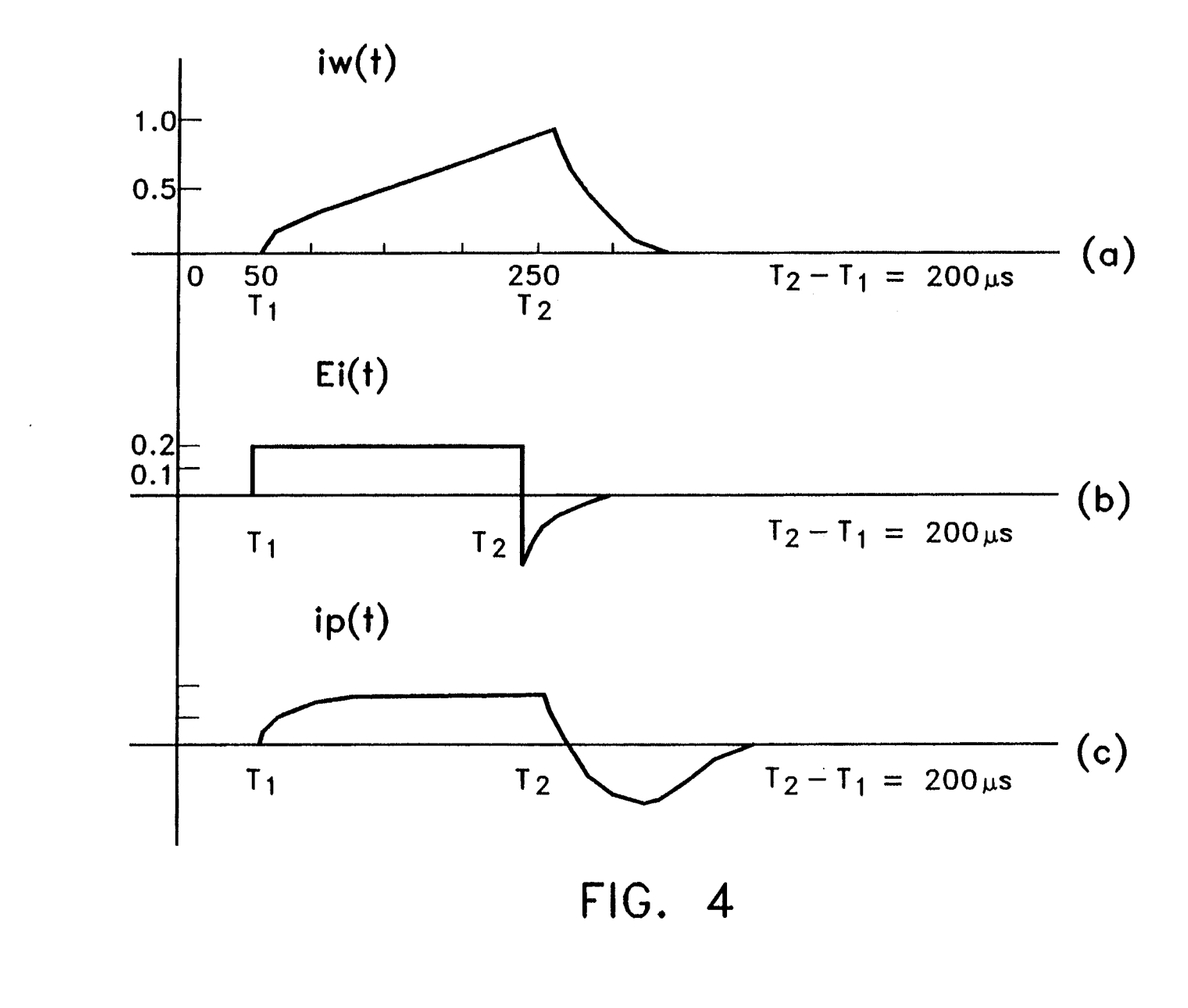

Excitation of the cable shield 10 under test is via a repetitively pulsed magnetic field with sawtooth time history that is proportional to current flowing in the windings of the inductive coupler 100 (see FIG. 4.). From FIG. 4, it can be seen that winding current varies linearly with time for 200 microseconds and decays to zero in a 100 microsecond interval. For purposes of this discussion, only the 200 microsecond linear range is of interest. The equation for winding current will be:

equation 9.
$$iw(t) = mt \text{ for } 0 \leq t \leq 200us$$

$$\text{where } m = \frac{Imax}{t} = \frac{Imax(\text{amperes})}{200us}$$

The magnetic field arising from winding current will induce, in the cable under test, a voltage proportional to the time derivative of winding current or, equation 10.
$$E(t) \text{ [induced]} \, ac \frac{d}{dt} mt \, ac \, m$$

where m is constant for $0 \leq t \leq 200$ us. (a=200 us)

The resulting waveform of induced voltage will be a rectangular pulse whose equation will be in the form of:

$$V(t) = Vmax \, [w(t) - w(t-a)] \quad \text{equation 11}$$

where Vmax=0.2
a=200 us and the 100 microsecond long decay interval (FIG. 4) is ignored.

This voltage source will have a Thevenin equivalent circuit source impedance Rs which, for the model described herein, equals 0.025 ohms.

Figure 7:
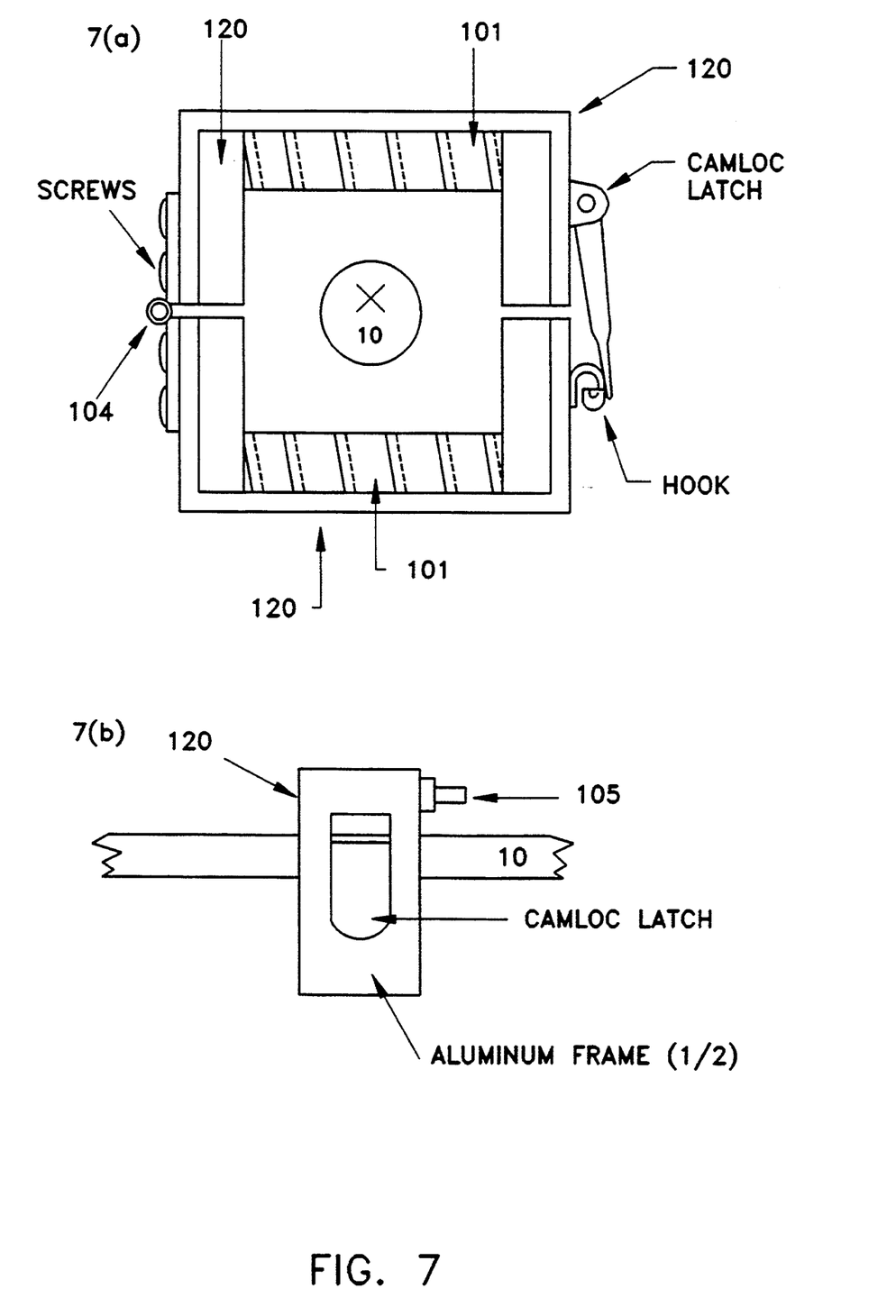
FIG. 7 shows an inductive coupler or current probe installed around a cable under test.
Figure 8:
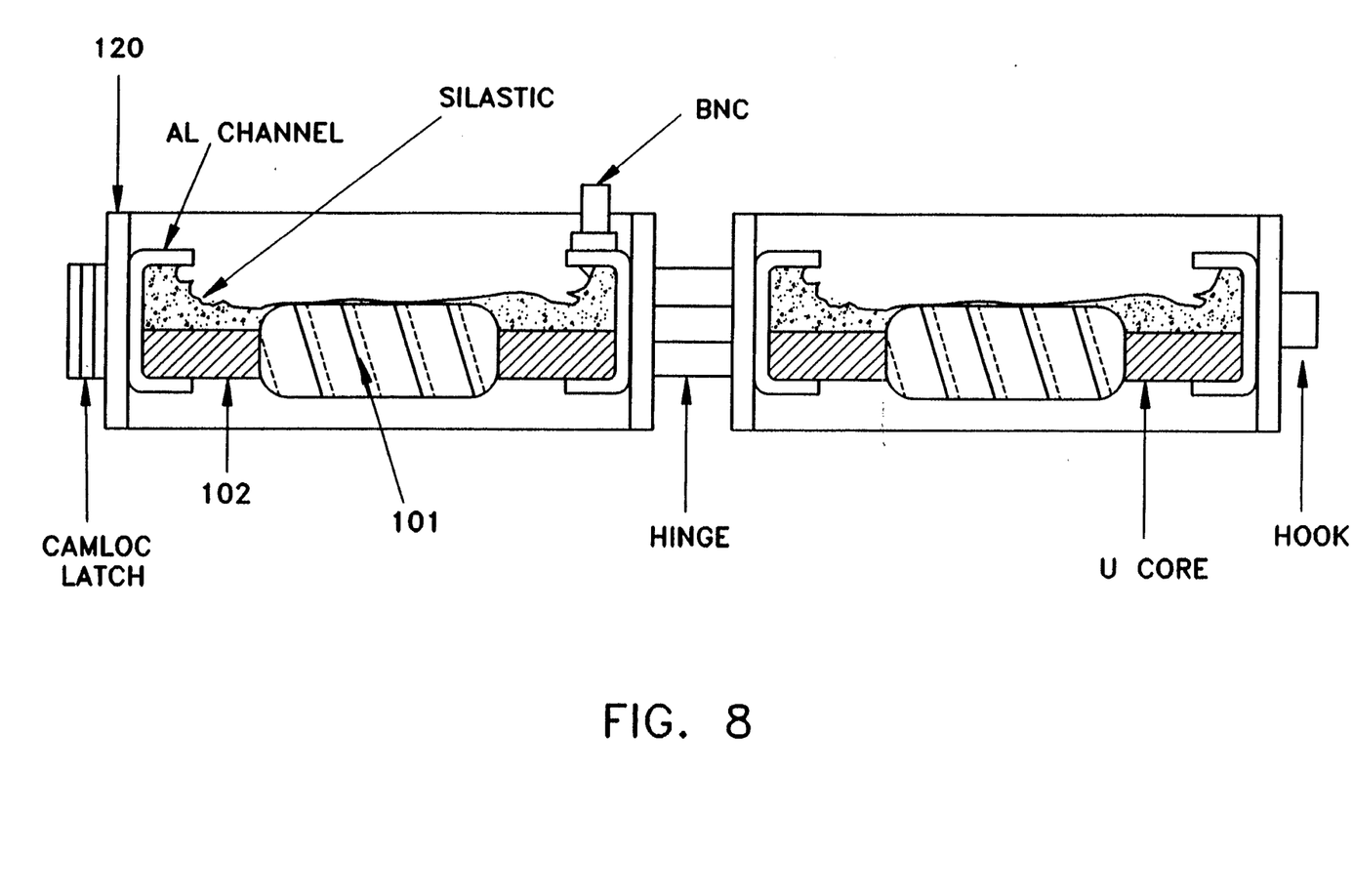
FIG. 8 shows an inductive coupler or current probe in an open condition.
Figure 9:
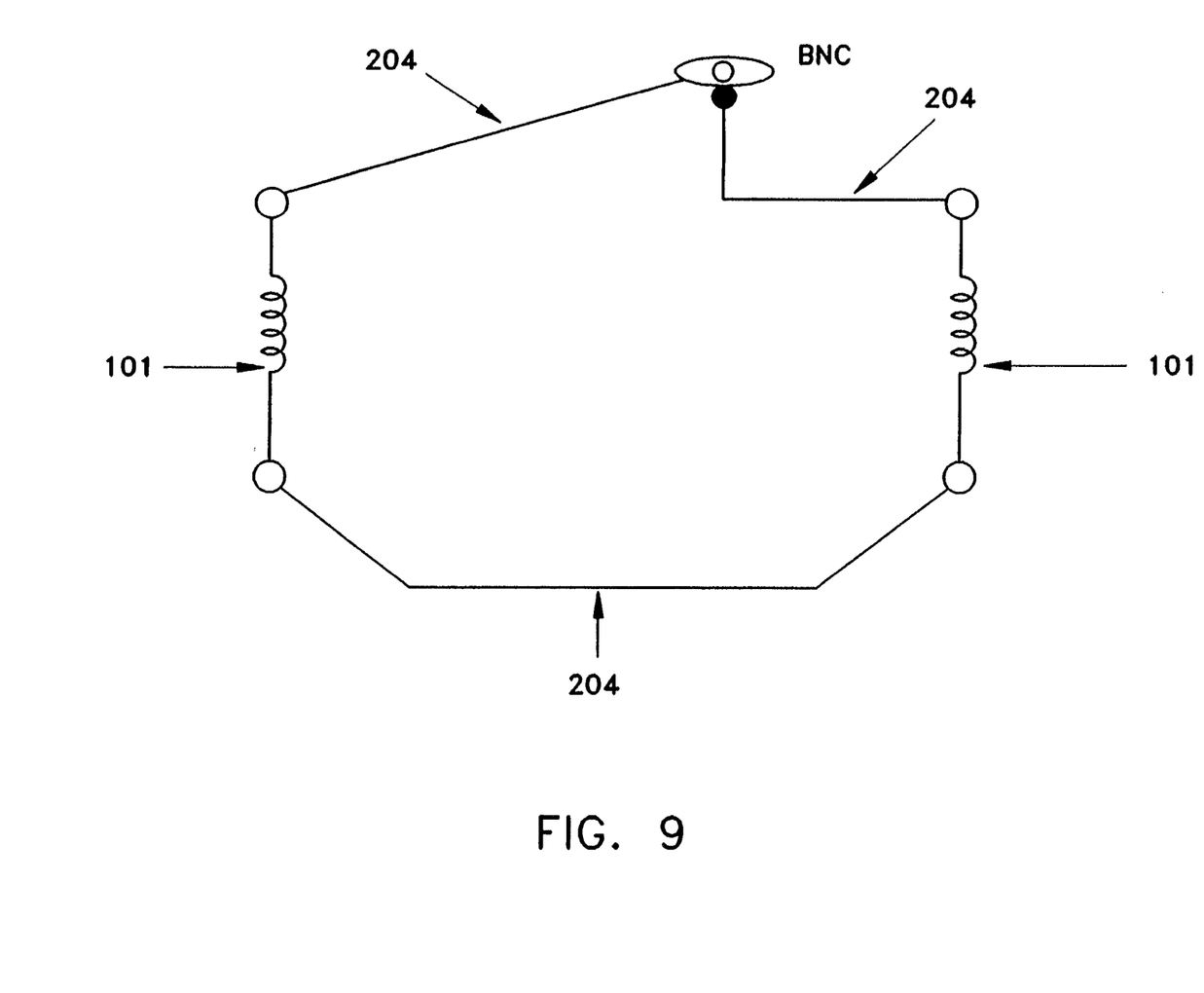
FIG. 9 is the electrical schematic of the inductive coupler or current probe.

Referring to FIGS. 7 and 8 the inductive coupler 100 and current probe 200 are similar in construction and have the same electrical schematic. Both are multiple turn coils wound on cores 102 housed within a two section aluminum frame 120. Silastic (Trademark) compound 121 and superglue (Trademark) hold the cores 102 within the aluminum frame 120. Each core half 102 has three layers of windings 101, a total per half core of 190 turns of #22 enamel coated magnet wire. Each layer of windings is separated by tape. The windings 101 on the left 102 and right 102 half cores are connected to provide additions of fluxes. The windings 101 are connected to a BNC coaxial panel jack 105 via #20 stranded teflon coated wire 204. The two frame halves 120 are joined by hinges 104. When in use coupler 100 and probe 200 surround the cable 10 under test; the two half cores 102 are joined; and the magnetic circuit is completed. When connected to the cable 10 under test, the coupler becomes the primary winding of a multiple turn step down transformer and the cable becomes a single turn secondary.

Figure 10:
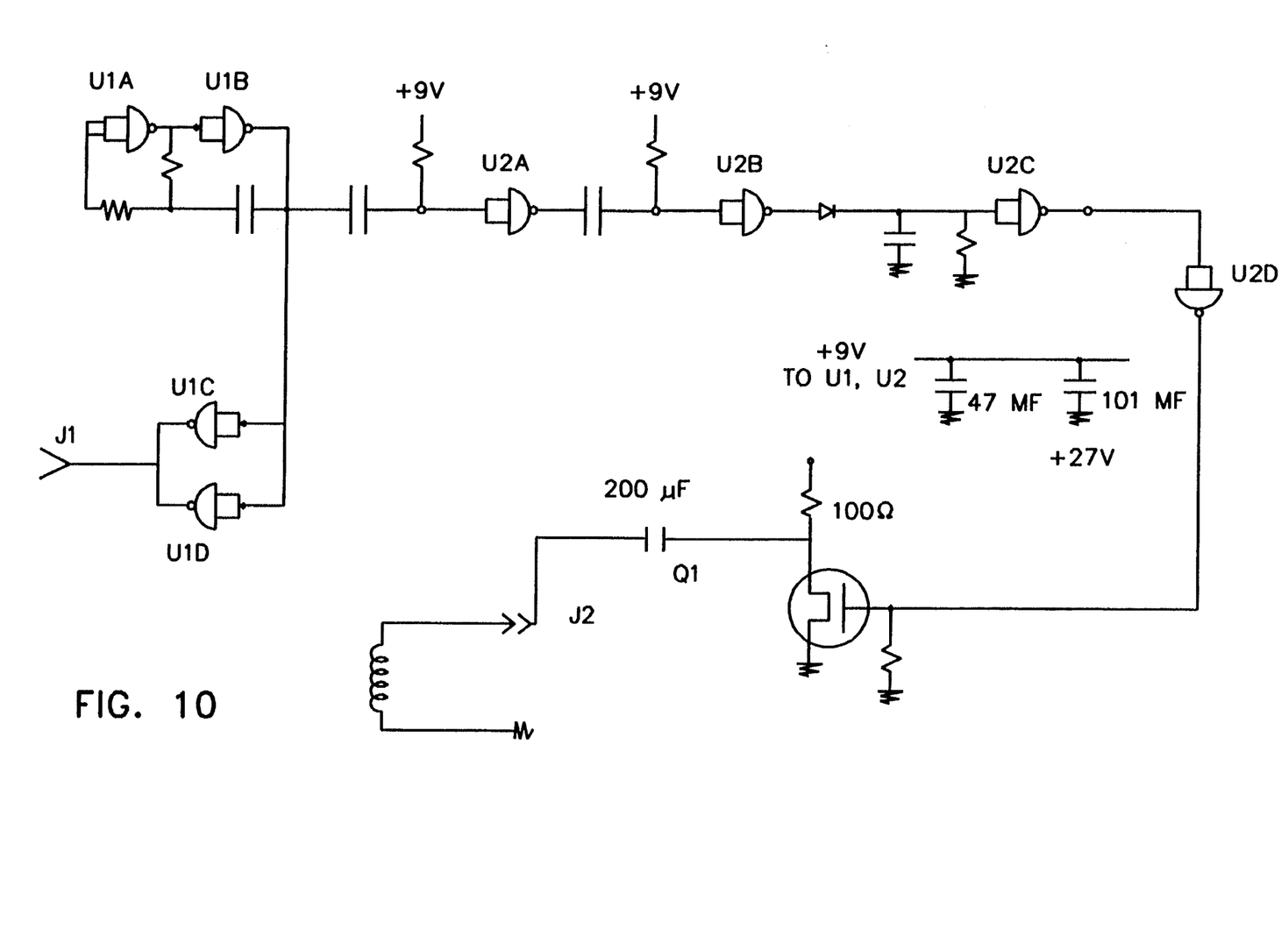
FIG. 10 is the electrical schematic of the coupler driver.
Figure 11:
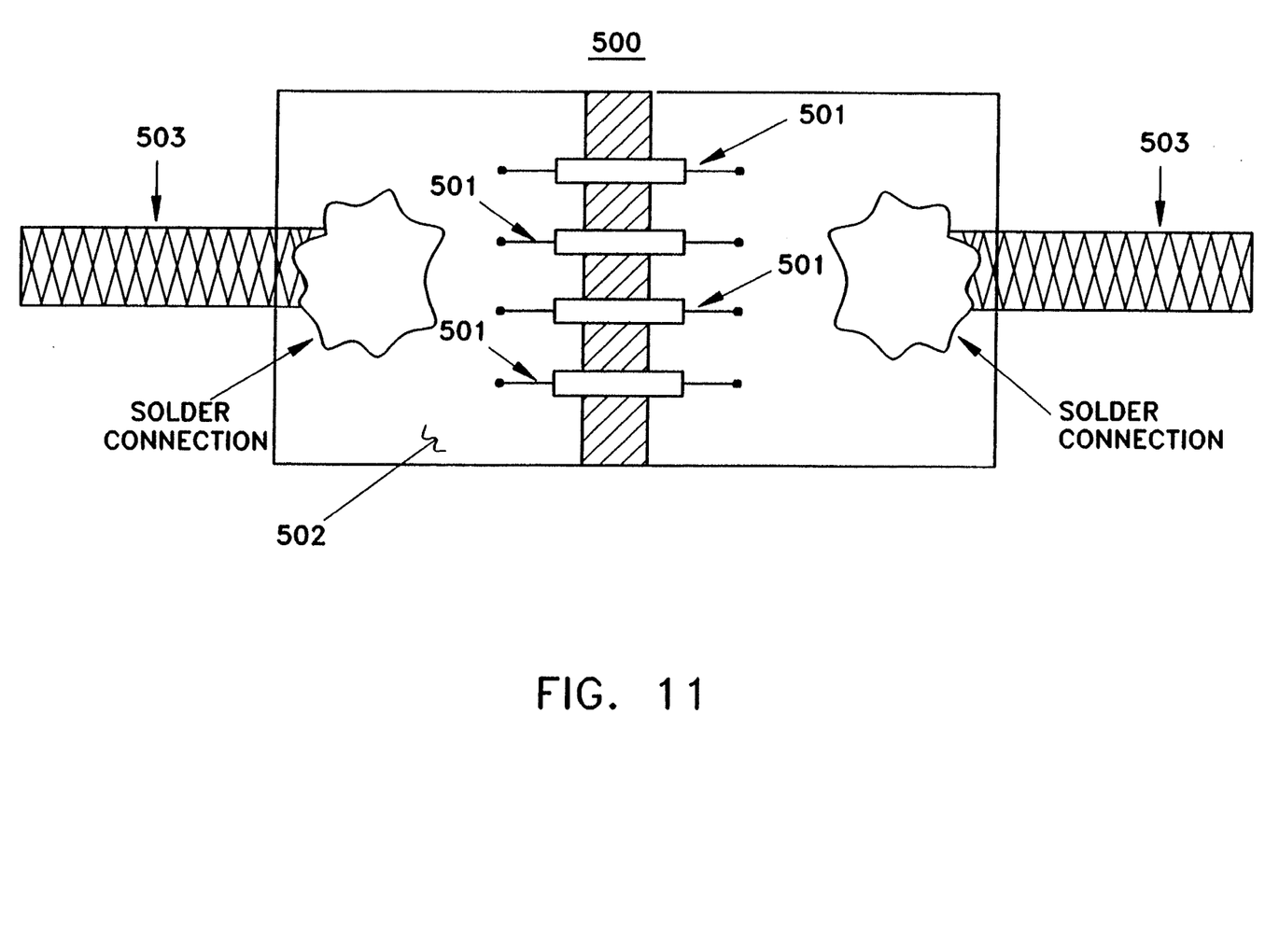
FIG. 11 is a drawing of a calibration resistance used in the prior art.
Figure 12:
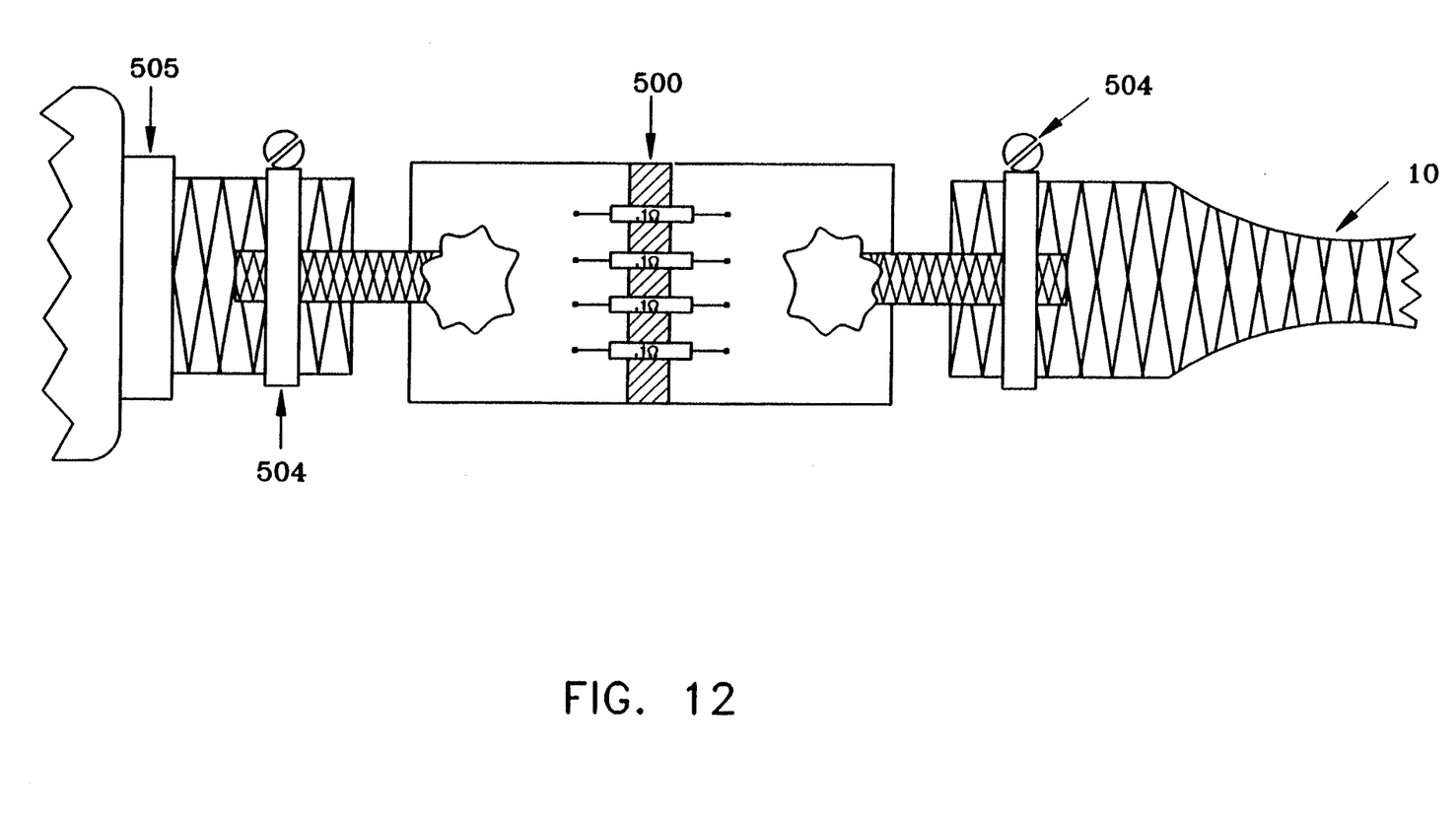
FIG. 12 shows the method of connecting the calibration resistance shown in FIG. 11.

The coupler 100 is driven by the coupler driver 300. Referring to FIG. 10, the driver 300 is a solid state switch (power MOSFET) through which an energy storage capacitor is discharged to provide coupler 100 winding current. The enable of the switch and trigger for other oscilloscope display are provided by astable and monostable multivibrators. The astable monostable combination generates a 200 microsecond pulse with a repetition frequency of 20 to 30 pulses per second that is delayed 50 microseconds from the start of the oscilloscope sweep. In the present version of the apparatus, the coupler driver 100 is powered by four 9 volt dry cell batteries; the circuit with batteries is housed within a 4×4×2 inch plastic box. Box outputs (coupler drive and scope trigger) are via two coaxial panel jacks (BNC).

Numerous other changes, modifications, and adaptations of the disclosed invention can be made by those having ordinary skill in the art without departing from the spirit of the disclosed invention. It is intended that such changes, modifications, and adaptations of the invention will be within the scope of the following appearing claims.

I claim:

1. A method of measuring resistance in a circuit without disconnecting said circuit comprising the steps of:

inductively applying a repetitive current pulse in a circuit under test;

inductively sampling said repetitive current pulse induced in said circuit under test;

sampling the voltage pulse induced across a portion of said circuit under test as a result of said inductively applied current pulse;

displaying a voltage waveform proportional to said repetitive current pulse induced in said circuit under test on a display means;

displaying a voltage waveform proportional to said sampled voltage across a portion of said circuit under test, wherein said displayed voltage waveform proportional to said sampled voltage across a portion of said circuit under test is representative of the resistance in said portion of said circuit under test and further wherein the total resistance of the circuit under test is computed thusly:

$$R_t = [E_i Z_t / V] - [R_s]$$

where $E_i$ is the voltage inductively inserted into the circuit under test, $Z_t$ is the transfer function of the inductive current probe in ohms, V is the peak amplitude of said inductively sampled waveform proportional to said repetitive current pulse induced in said circuit under test, and $R_s$ is the equivalent source impedance in ohms associated with the voltage inductively inserted into the circuit under test.

* * * * *